(12) United States Patent
Ridings et al.

(10) Patent No.: US 8,985,436 B2
(45) Date of Patent: Mar. 24, 2015

(54) PEER-TO-PEER RADIO FREQUENCY COMMUNICATIONS FOR MANAGEMENT OF RFID READERS

(75) Inventors: Barry L. Ridings, Fayetteville, AR (US); Philip Lazo, Mount Airy, MD (US); Mohammad Soleimani, Gaithersburg, MD (US)

(73) Assignee: Symbol Technologies, Inc., Holtsville, NY (US)

( * ) Notice: Subject to any disclaimer, the term of this patent is extended or adjusted under 35 U.S.C. 154(b) by 1204 days.

(21) Appl. No.: 11/275,598

(22) Filed: Jan. 18, 2006

(65) Prior Publication Data

US 2007/0164109 A1   Jul. 19, 2007

(51) Int. Cl.
G06F 17/00   (2006.01)
G01R 31/302   (2006.01)

(52) U.S. Cl.
CPC .................................. *G01R 31/302* (2013.01)
USPC ....................................................... 235/375

(58) Field of Classification Search
CPC . G06K 7/0008; G06K 17/0022; G06K 17/00; G06K 19/0723; G06K 19/07716; G06K 1/14; G06K 7/0021; G06K 7/0034; G06K 7/0043; G06K 7/0047; G06K 7/006; G06K 7/0095; G06K 7/10465; G06F 11/1456
USPC .......... 235/375, 492; 705/68; 340/928, 572.1, 340/572.7; 455/562.1
See application file for complete search history.

(56) References Cited

U.S. PATENT DOCUMENTS

| | | | |
|---|---|---|---|
| 5,809,142 A * | 9/1998 | Hurta et al. ..................... | 705/68 |
| 5,995,019 A | 11/1999 | Chieu et al. | |
| 6,107,910 A | 8/2000 | Nysen | |
| 6,433,671 B1 | 8/2002 | Nysen | |
| 6,531,957 B1 | 3/2003 | Nysen | |
| 6,580,358 B1 | 6/2003 | Nysen | |
| 6,950,009 B1 | 9/2005 | Nysen | |
| 7,265,675 B1 * | 9/2007 | Carrender et al. ......... | 340/572.7 |
| 7,267,275 B2 * | 9/2007 | Cox et al. ...................... | 235/451 |
| 2004/0134984 A1 | 7/2004 | Powell et al. | |
| 2004/0160322 A1 | 8/2004 | Stilp | |
| 2005/0009122 A1 | 1/2005 | Whelan et al. | |
| 2005/0128159 A1 * | 6/2005 | Wang et al. .................... | 343/844 |
| 2005/0143133 A1 * | 6/2005 | Bridgelall .................. | 455/562.1 |
| 2006/0006986 A1 * | 1/2006 | Gravelle et al. ............. | 340/572.1 |
| 2006/0022044 A1 * | 2/2006 | Smets et al. .................. | 235/492 |
| 2006/0022800 A1 * | 2/2006 | Krishna et al. ............. | 340/572.1 |
| 2007/0164109 A1 | 7/2007 | Ridings et al. | |

FOREIGN PATENT DOCUMENTS

| | | |
|---|---|---|
| GB | 2406023 A | 3/2005 |
| WO | WO2005008575 A1 | 1/2005 |
| WO | WO2005081183 A1 | 9/2005 |

OTHER PUBLICATIONS

Search Report and Written Opinion for International Application No. PCT/US07/01118 mailed Oct. 18, 2007, 6 pages.

* cited by examiner

*Primary Examiner* — Thien T Mai

(57) ABSTRACT

Methods, systems, and apparatuses for testing radio frequency identification (RFID) readers are described. A network communications capability of a first reader may be tested. A second reader may be instructed to perform testing of a radio frequency (RF) communications capability of the first reader. The second reader may include a reader test module. The reader test module includes a first logic module configured to test a forward link of the first reader, and a second logic module configured to test a backward link of the first reader.

9 Claims, 4 Drawing Sheets

PEER-TO-PEER RADIO FREQUENCY COMMUNICATIONS FOR MANAGEMENT OF RFID READERS

BACKGROUND OF THE INVENTION

1. Field of the Invention

The invention relates to radio frequency identification (RFID) readers, and in particular, to diagnostic communications between RFID readers.

2. Background Art

Radio frequency identification (RFID) tags are electronic devices that may be affixed to items whose presence is to be detected and/or monitored. The presence of an RFID tag, and therefore the presence of the item to which the tag is affixed, may be checked and monitored wirelessly by devices known as "readers." Readers typically have one or more antennas transmitting radio frequency signals to which tags respond. Since the reader "interrogates" RFID tags, and receives signals back from the tags in response to the interrogation, the reader is sometimes termed as "reader interrogator" or simply "interrogator".

With the maturation of RFID technology, efficient communication between tags and interrogators has become a key enabler in supply chain management, especially in manufacturing, shipping, and retail industries, as well as in building security installations, healthcare facilities, libraries, airports, warehouses etc.

Reading of tags often takes place in an environment where the readers and their antennas experience physical abuse, such as in a warehouse environment, where objects may impact the reader antenna. Determining whether a reader has failed, such as due to damage from an impact, can be difficult. Typically, first, it has to be noticed that the reader may not be operating properly. Next, an operator has to approach the location of the reader. The operator then places a tag in the vicinity of the reader to check whether the reader can read the tag, to verify operation of the reader. This process is manually intensive and time consuming.

Thus, what is needed are improved ways of detecting RFID readers that are not operating properly, and improved ways of diagnosing the particular problems.

BRIEF SUMMARY OF THE INVENTION

Methods, systems, and apparatuses for testing radio frequency identification (RFID) readers are described. The improved testing is enabled through the use of operational readers to test potentially malfunctioning readers. Thus, readers that are present in the field can be configured to test other readers. Using readers to test other readers substantially automates the reader test process, so that the requirement for human interaction during reader testing is reduced or eliminated.

For example, a radio frequency (RF) communications-related functionality of a first reader is tested by a second reader. Furthermore, a network communications functionality of the first reader may be tested by a server coupled to the first reader through a communications network.

A malfunction of the first reader may be suspected prior to initiating the testing. Alternatively, the testing of the first reader may occur on a periodic basis, regardless of whether a malfunction of the first reader is suspected.

The second reader may be instructed to perform testing of the first reader. Alternatively, the second reader may self-initiate the testing (e.g., according to a timer).

The second reader may test a forward link RF communications capability of the reader (e.g., a "transmit side") and/or may test a backward link RF communications capability of the reader (e.g., a "receive side").

The second reader may include a reader test module. The reader test module includes a first logic module configured to test the forward link of the first reader, and a second logic module configured to test the backward link of the first reader.

These and other objects, advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 1 shows an environment where RFID readers communicate with an exemplary population of RFID tags.

FIG. 2 shown a block diagram of receiver and transmitter portions of a RFID reader.

Figure 1:
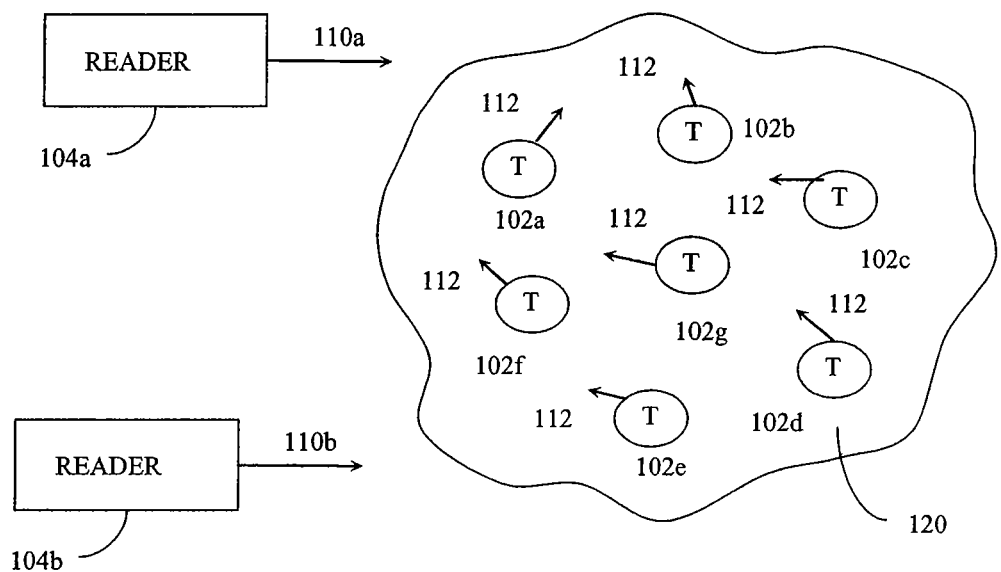

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

Methods, systems, and apparatuses for RFID devices, such as readers, are described herein. For example, methods, systems, and apparatuses for improved testing of readers are described.

Real world installations of RFID readers are often difficult to maintain. Typically, a great deal of manual labor is required to manage the health of RFID readers, which may be coupled to a communications network. Readers frequently "lock up" (e.g, stop communicating over the communications network, stop reading tags, etc.), and as a result, field service technicians must be called to physically examine the malfunctioned reader to determine the source of the problem. Typically, the technician tests the malfunctioned reader, re-configures the malfunctioned reader, and/or rests the reader to regain proper system operation.

Embodiments of the present invention overcome problems with testing readers present in conventional systems. For example, according to embodiments, readers are used to test other readers, in a peer-to-peer reader testing scheme. Thus, readers that are present in an RFID environment having multiple readers are used to test other readers. In this manner, the need for field service technicians, or other special purpose testing systems, is reduced or eliminated.

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "down," "top," "bottom," "vertical," "horizontal," etc.) used herein are for purposes of illustration only, and that practical implementations of the structures described herein can be spatially arranged in any orientation or manner.

Example RFID System Embodiment

Before describing embodiments of the present invention in detail, it is helpful to describe an example RFID communications environment in which the invention may be implemented. FIG. 1 illustrates an environment 100 where RFID tag readers 104 communicate with an exemplary population 120 of RFID tags 102. As shown in FIG. 1, the population 120 of tags includes seven tags 102a-102g. A population 120 may include any number of tags 102.

Environment 100 includes any number of one or more readers 104. For example, environment 100 includes a first reader 104a and a second reader 104b. Readers 104a and/or 104b may be requested by an external application to address the population of tags 120. Alternatively, reader 104a and/or reader 104b may have internal logic that initiates communication, or may have a trigger mechanism that an operator of a reader 104 uses to initiate communication. Readers 104a and 104b may also communicate with each other in a reader network.

As shown in FIG. 1, reader 104a transmits an interrogation signal 110 having a carrier frequency to the population of tags 120. Reader 104b transmits an interrogation signal 110b having a carrier frequency to the population of tags 120. Readers 104a and 104b typically operate in one or more of the frequency bands allotted for this type of RF communication. For example, frequency bands of 902-928 MHz and 2400-2483.5 MHz have been defined for certain RFID applications by the Federal Communication Commission (FCC).

Various types of tags 102 may be present in tag population 120 that transmit one or more response signals 112 to an interrogating reader 104, including by alternatively reflecting and absorbing portions of signal 110 according to a time-based pattern or frequency. This technique for alternatively absorbing and reflecting signal 110 is referred to herein as backscatter modulation. Readers 104a and 104b receive and obtain data from response signals 112, such as an identification number of the responding tag 102. In the embodiments described herein, a reader may be capable of communicating with tags 102 according to any suitable communication protocol, including binary traversal protocols, slotted aloha protocols, Class 0, Class 1, EPC Gen 2, any others mentioned elsewhere herein, and future communication protocols.

Figure 2:
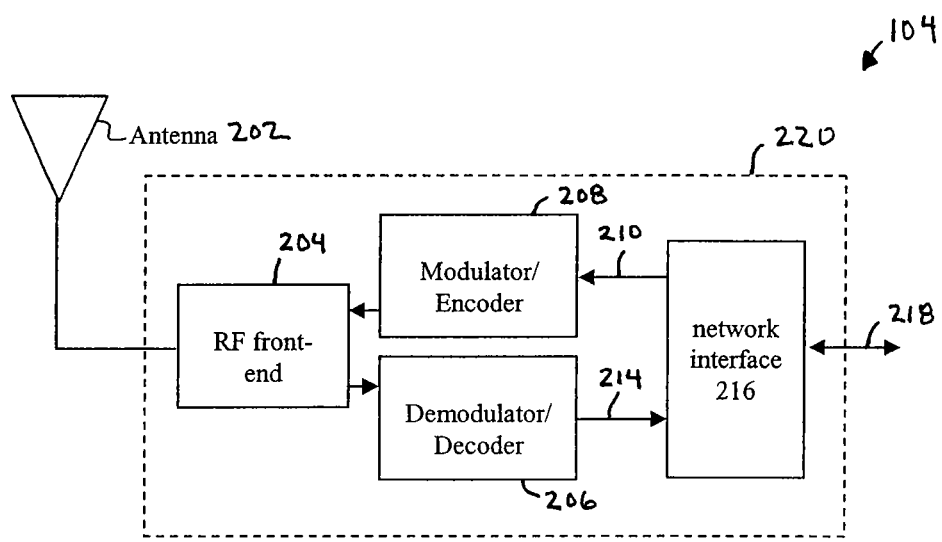

FIG. 2 shows a block diagram of a receiver and transmitter portion 220 of an example RFID reader 104. Reader 104 includes one or more antennas 202, a RF front-end 204, a demodulator/decoder 206, a modulator/encoder 208, and a network interface 216. These components of reader 104 may include software, hardware, and/or firmware, or any combination thereof, for performing their functions.

Reader 104 has at least one antenna 202 for communicating with tags 102 and/or other readers 104. RF front-end 204 may include one or more antenna matching elements, amplifiers, filters, an echo-cancellation unit, a down-converter, and/or an up-converter. RF front-end 204 receives a tag response signal through antenna 202 and down-converts (if necessary) the response signal to a frequency range amenable to further signal processing. Furthermore, RF front-end 204 receives a modulated encoded interrogation signal from modulator/encoder 208, up-converts (if necessary) the interrogation signal, and transmits the interrogation signal to antenna 202 to be radiated.

Demodulator/decoder 206 is coupled to an output of RF front-end 204, receiving a modulated tag response signal from RF front-end 204. Demodulator/decoder 206 demodulates the tag response signal. The tag response signal may include backscattered data encoded according to FM0 or Miller encoding formats. Demodulator/decoder 206 outputs a decoded data signal 214. Decoded data signal 214 may be further processed in reader 104. Additionally or alternatively, decoded data signal 214 may be transmitted to a subsequent computer system for further processing.

Modulator/encoder 208 is coupled to an input of RF front-end 204, and receives an interrogation request 210. Modulator/encoder 208 encodes interrogation request 210 into a signal format, such as one of FM0 or Miller encoding formats, modulates the encoded signal, and outputs the modulated encoded interrogation signal to RF front-end 204.

In an embodiment, reader 104 includes network interface 216 to interface reader 104 with a communications network 218. When present, network interface 216 is used to provide interrogation request 210 to reader 104, which may be received from a remote server coupled to communications network 218. Furthermore, network interface 216 is used to transmit decoded data signal 214 from reader 104 to a remote server coupled to communications network 218.

In some cases, reader 104 may stop reading tags due to lock ups or firmware code errors occurring in RF front end 204. Even though RF front end 204 is not operating properly, the reader back-end platform portion (which may include modulator/encoder 208, demodulator/decoder 206, and network interface 216) may still appear to be working properly, and may still properly respond to polling requests from communications network 218. Thus, a problem with RF front end 204 can be difficult to detect, and thus may result in days of lost operation before an on-site physical inspection of reader 104 is performed. Furthermore, any of demodulator/decoder 206, modulator/encoder 208, and/or network interface 216 may suffer malfunctions. When network interface 216 is malfunctioning, reader 104 may not be able to communicate over communications network 218.

Embodiments of the present invention add a diagnostic feature to RFID readers, leveraging the attribute that many RFID readers are installed near each other in real world applications. Thus, peer-to-peer (i.e., reader-to-reader) communications can be performed to diagnose reader failures in addition to queries over communications network 218 from a back end server. The peer-to-peer communications use an already existing RF link (e.g., RF front-end 204) of reader 104 that is typically used to interrogate tags, to test other readers in a local area to diagnose their problems. Any diagnostic data can be reported through communications network 218 to the back end server by the testing reader and/or by the malfunctioning reader (when possible).

Embodiments of the present invention are described in detail below. Such embodiments may be implemented in environment 100 shown in FIG. 1, in reader 104 shown in FIG. 2, and/or in alternative environments and RFID devices.

Example Reader Test Embodiments

Figure 3:
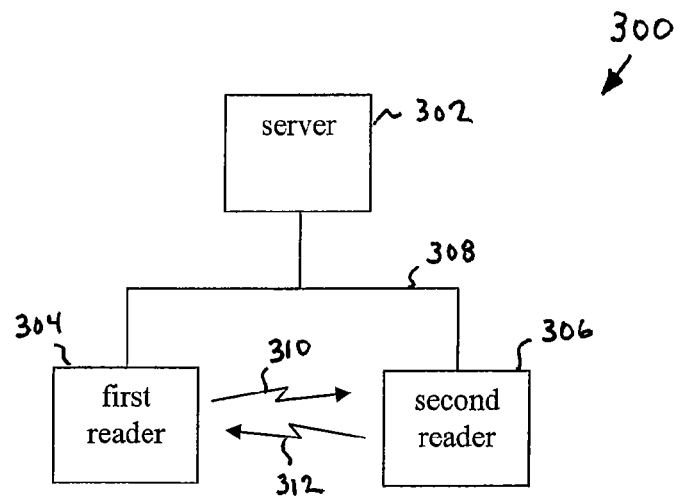
FIG. 3 shows a block diagram of an example reader test system, according to an embodiment of the present invention.

FIG. 3 shows a block diagram of an example reader test system 300, according to an embodiment of the present invention. As shown in FIG. 3, system 300 includes a server 302, a first reader 304, and a second reader 306. Server 302 is coupled to first reader 304 and to second reader 306 by a communications network 308. Communications network 308 may couple server 302 to first and second readers 304 and 306 by a common link or bus, or may couple first and second readers 304 and 306 to server 302 by separate links. Communications network 308 may be a wired or wireless network, or may include a combination of both wired and wireless links. For example, wired links for communications network 308 may include an Ethernet link, a FIREWIRE link, and/or other types of wired communication links. Example wireless links for communications network 308 may include a wireless local area network (WLAN) link (including a IEEE 802.11 WLAN standard link), a BLUETOOTH link, and/or other types of wireless communication links. Communications network 308 may include a local area network (LAN) link, a wide area network (WAN) link (e.g., the Internet), and/or a personal area network (PAN) link.

In the current embodiment, second reader 306 tests first reader 304, and thus is referred to as the "test reader." For example, second reader 306 may receive an instruction from server 302 over communications network 308 to test first reader 304. Alternatively, second reader 306 may initiate test of first reader 304 on its own. Note that first reader 304 may also include the test functionality described herein for second reader 306. Thus, first reader 304 and second reader 306 may be used to test each other and/or other nearby readers.

Figure 4:
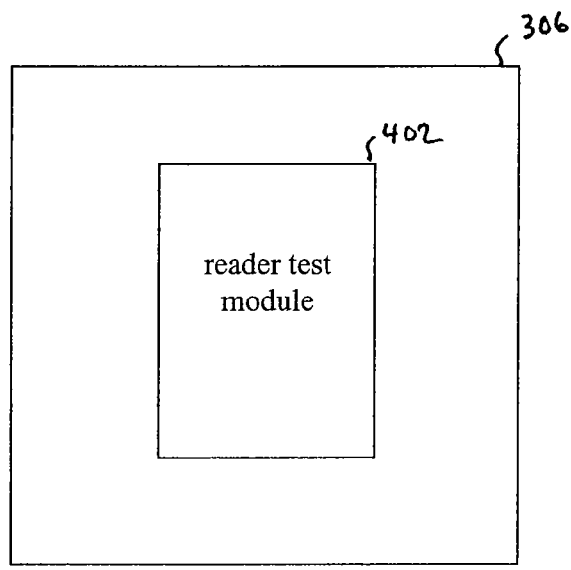
FIGS. 4 and 5 show example readers, according to embodiments of the present invention.

FIG. 4 shows an example block diagram for second reader 306. As shown in FIG. 4, second reader 306 may include a reader test module 402. Reader test module 402 includes functionality for performing a test of readers, such as first reader 304 of FIG. 3. Reader test module 402 may include hardware, software, firmware, and/or any combination thereof, for performing a test of one or more readers. For example, reader test module 402 may include code that may be stored on a computer readable medium, and/or may include a processor, including a microprocessor or digital signal processor (DSP), and/or other logic elements. Reader test module 402 enables second reader 306 to test readers, including any kind of testing of a reader that may be performed remotely by another reader.

In this document, the terms "computer program medium" and "computer usable medium" are used to generally refer to media such as a removable storage unit, a hard disk installed in hard disk drive, and signals (i.e., electronic, electromagnetic, optical, or other types of signals capable of being received by a communications interface). These computer program products are means for providing software to a computer system. The invention, in an embodiment, is directed to such computer program products.

Figure 5:
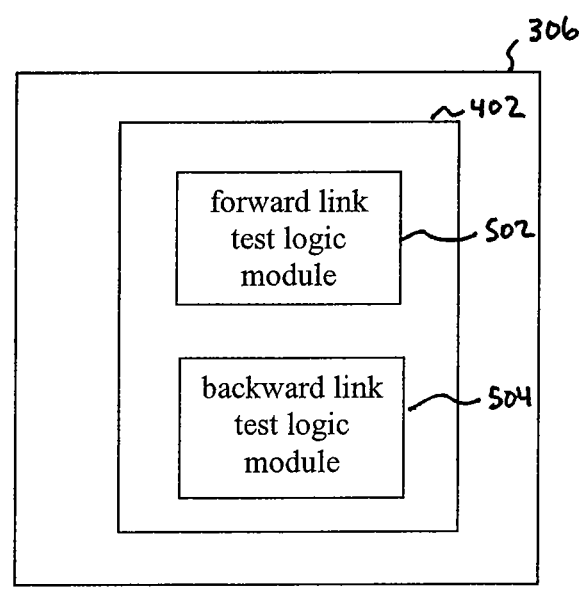

For example, FIG. 5 shows an example block diagram of second reader 306, showing further example details of reader test module 402. As shown in FIG. 5, reader test module 402 includes a forward link test logic module 502 and a backward link test logic module 504. Forward link test logic module 502 is configured to perform a test of a forward link (e.g. transmission functionality) of a reader. For example, forward link test logic module 502 may test whether a potentially malfunctioning reader is transmitting a radio frequency signal, such as a continuous wave (CW) signal and/or tag interrogation signal. Backward link test logic module 504 is configured to perform a test of a backward link (e.g., reception functionality) of a reader. For example, backward link test logic module 504 may test whether a potentially malfunctioning reader is able to receive a tag response signal.

Figure 6:
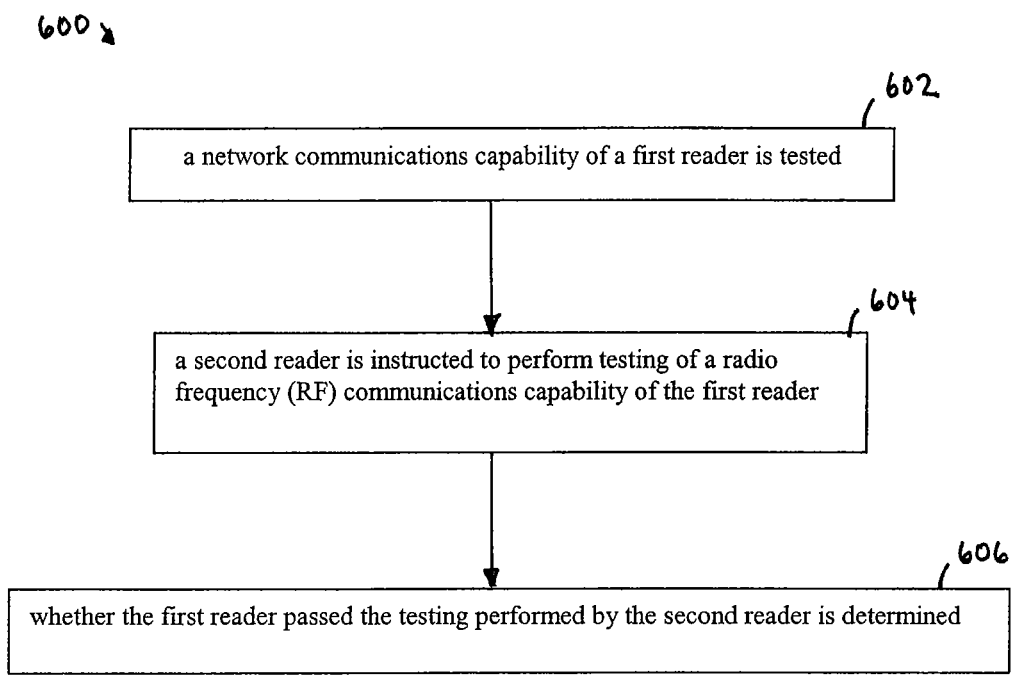
FIGS. 6 and 7 show example flowcharts for testing readers, according to embodiments of the present invention.

FIG. 6 shows a flowchart 600 providing example steps for testing a reader. Other structural and operational embodiments will be apparent to persons skilled in the relevant art(s) based on the following discussion. The steps shown in FIG. 6 do not necessarily have to occur in the order shown. The steps of FIG. 6 are described in detail below with respect to system 300 of FIG. 3.

Flowchart 600 begins with step 602. In step 602, a network communications capability of a first reader is tested. For example, it may be desired to test whether a reader, such as first reader 304, is capable of communicating properly over communications network 308. For example, an Ethernet, FIREWIRE, and/or other network interface (e.g., network interface 216 of reader 104 in FIG. 2) of first reader 304 may be tested. To test network communications capability, first reader 304 may attempt to initiate communication with server 302 over communications network 308, or server 302 may send a request for data, or perform other communication, with first reader 304 over communications network 308. If first reader 304 responds properly to server 302, server 302 may determine that network communications capability of first reader 304 is operating properly. If first reader 304 does not respond properly to server 302, server 302 determines that network communications capability of first reader 304 is not operating properly. If first reader 304 fails the network communications capability testing, an operator may be alerted to repair first reader 304, remove first reader 304 from operation, and/or take other action.

In step 604, a second reader is instructed to perform testing of a radio frequency (RF) communications capability of the first reader. For example, second reader 306 may be instructed by server 302 to test RF communications capability of first reader 304. Step 604 may be performed by reader test module 402 of second reader 306, for example. To test RF communications capability, second reader 306 may test a forward link and/or a backward link of first reader 304.

In step 606, whether the first reader has passed the testing performed by the second reader is determined. For example, server 302 and/or second reader 306 determine whether first reader 304 passes the RF communication capability testing, by determining whether first reader 304 provides proper responses to test(s) performed by second reader 306. Example tests that may be performed by second reader 306 are described below. If first reader 304 fails the RF communications capability testing, an operator may be alerted to repair first reader 304, remove first reader 304 from operation, and/or take other action.

Note that if it is determined in step 602 that the first reader is not able to communicate properly on the network, the first reader may instead attempt to communicate with the second reader. This communication may be prompted by first the first reader (if the failure is known by the first reader) or by a signal received from the second reader. For example, if first reader 304 stores data, such as tag data read by first reader 304, that it desires to transmit over communications network 308, first reader 304 may instead transmit the data to second reader 306. The data may be communicated by a wired link (if present) between first and second readers 304 and 306, or by wireless communication signals. In this manner, second reader 306 can provide the data to server 302 over communications network 308. Furthermore, after first reader 304 determines that it has failed network communications testing, first reader 304 may initiate further internal testing to determine a source of the problem.

Figure 7:
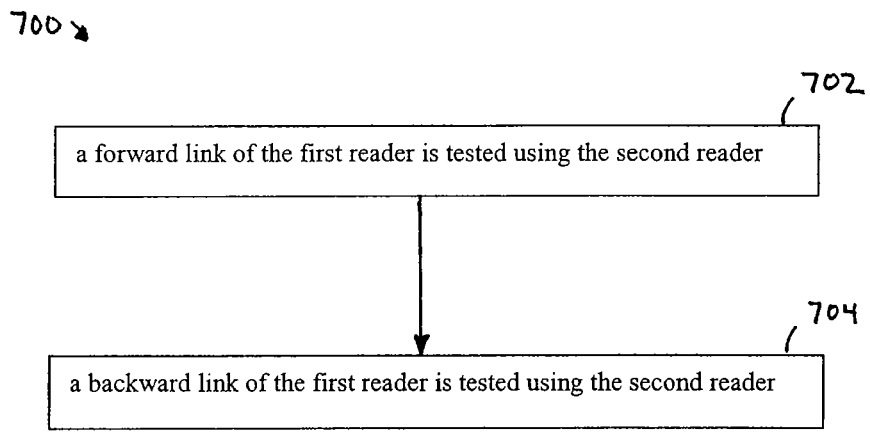

FIG. 7 shows a flowchart 700 providing example steps for testing a first reader with a second reader. Other structural and operational embodiments will be apparent to persons skilled in the relevant art(s) based on the following discussion. The steps shown in FIG. 7 do not necessarily have to occur in the order shown. The steps of FIG. 7 are described in detail below.

Flowchart 700 begins with step 702. In step 702, a forward link of the first reader is tested using the second reader. For example, second reader 306 may be used to test the forward link of first reader 304. To test a forward link of first reader 304, second reader 306 may monitor for an RF signal 310 transmitted by first reader 304. For example, RF signal 310 may be a CW signal used to power tags, or may be an interrogation signal for tags. If first reader 304 fails the forward link testing, an operator may be alerted to repair first reader 304, remove first reader 304 from operation, and/or take other action.

In step 704, a backward link of the first reader is tested using the second reader. To test a backward link of first reader 304, second reader 306 may transmit a simulated tag response signal 312 intended to be received by first reader 304 (if operating properly). For example, tag response signal 312 may be a simulated backscatter signal. If first reader 304 receives simulated tag response signal 312, first reader 304 provides an indication to server 302 (over communications network 308) that simulated tag response signal 312 was received, and the backward link of first reader 304 may be confirmed to be operational. If first reader 304 fails the backward link testing (e.g., by not providing the indication to server 302), an operator may be alerted to repair first reader 304, remove first reader 304 from operation, and/or take other action.

In an embodiment, simulated tag response signal 312 may include a data string. The data string may be sent as the identification number normally transmitted in a tag response, or may sent in another data field of the tag response. For example, the data string may be a particular series of bits that when received by first reader 304, causes first reader 304 to perform a self-diagnostic test. First reader 304 transmits the results of the self-diagnostic test to server 302. Different data strings may be transmitted to first reader 304 to cause first reader 304 to perform different diagnostic tests, if desired. In this manner, different aspects of first reader 304 can be tested. Alternatively, a particular data string may cause first reader 304 to perform a complete self-diagnostic test.

Embodiments of the present invention may be implemented in a variety of environments, including a commercial environment, such as in a warehouse, a business, or store, and in a military or other non-commercial environment. Furthermore, the test reader described herein may be attached to a stationary structure or to a mobile structure.

An example application is a dock door location of a warehouse, through which tagged items enter and exit the warehouse. In such an environment, readers 304 and 306 may be mounted to face each other across the dock door. In this manner, the tagged items entering and exiting the warehouse can be read by one or both of readers 304 and 306 to keep track of warehouse inventory, etc. However, reader 304 may stop reading tags due to a variety of reasons. Furthermore, although reader 304 is not reading tags properly, it may still be capable of communicating over communications network 308. In a conventional system, it is very difficult to determine whether RF front end 204 has stopped operating unless a tag is physically placed in the interrogation field of reader 304. According to the present invention, this physical inspection is not required, because reader 306 can be instructed to test reader 304, and reader 306 can perform the test without human interaction.

For example, reader 306 may be instructed by server 302 to test the forward link of reader 304, such as by monitoring whether a RF signal is transmitted by the antenna of reader 304. Damage to the forward link of reader 304 may include a damaged antenna, a malfunctioning or damaged RF transmitter, etc. If reader 304 is operating, reader 306 will receive the transmitted RF signal. Reader 304 may optionally analyze characteristics of the transmitted RF signal (e.g., amplitude, noise level, frequency, phase, etc.) to determine how well the forward link of reader 304 is operating. Reader 306 can provide this analysis information to server 302.

Furthermore, reader 306 can test the backward link of reader 304, such as by transmitting a simulated tag backscatter response to be received by reader 304, according to an appropriate tag protocol. If the receiver of reader 304 is functioning properly, it will receive the simulated tag response. An indication of the receipt of the simulated tag response can be provided by reader 304 to server 302. Furthermore, if the simulated tag response included a test data string, the test data string can trigger a diagnostic analysis in reader 304. Reader 304 may transmit a message including data regarding the diagnostic analysis through communications network 308. If its network interface is not operating properly, reader 304 may alternatively transmit an RF signal including the diagnostic information to reader 306, which may be provided by reader 306 through communications network 308 to server 302.

In a further example embodiment, reader 306 may transmit a simulated backscatter signal through its RF link to reader 304. The transmitted signal may contain a special EPC code (or other data format) that commands reader 304 to reset and/or to perform other functions. For example, this may be useful if tag reading rates performed by reader 304 have fallen below an established desired rate, as detected by a remote management system, as detected as part of a routine maintenance check that readers 304 and 306 perform on each other periodically (e.g., across a dock door), or detected in any other manner.

In an embodiment, a reader management system may assign one reader in a network or local area to be a "master reader." For example, in system 300 shown in FIG. 3, second reader 306 may be assigned as the master reader. The master reader may be used to communicate with other readers to cause them to cease their RF communications in certain situations. For example, it may be desired to avoid interference from adjacent readers for a period of time that an important shipment is moving through a particular dock door. For instance, it may be desired to avoid interference from forklift-mounted readers, handheld readers, and fixed readers during that time period. In such a situation, the master reader transmits a master signal through its RF link. The master signal may optionally include a time period for other readers to cease RF transmissions, or there may be a default setting for the time period. Other readers in the vicinity of the master reader receive the signal, and cease transmitting during that time period, to ensure that the RF environment is sufficiently clear. The master reader (or other designated reader) reads the items in the shipment during the time period. Thus, the master reader enables the tags of the critical shipment to be read with higher reliability, due to the lack of interference from other readers during the designated time period.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method for testing a first radio frequency identification (RFID) reader, comprising:
    testing, by a server, a radio frequency (RF) communications functionality of the first RFID reader using a second RFID reader, wherein the RF communications functionality includes transmitting an RF signal from the first RFID reader to test a forward link of the first RFID reader using the second RFID reader and transmitting a second RF signal from the second RFID reader to the first RFID reader to test a backward link of the first RFID reader, and wherein the test of the backward link comprises providing, by the first RFID reader, an indication to the server that the second RF signal was received; and
    transmitting an indication from the second RFID reader to the server that the first RFID reader has failed if the RF signal is not received by the second RFID reader;
    further comprising if the first RFID reader receives the second RF signal but fails to provide the indication to the server, transmitting stored data by the first RFID reader to the second RFID reader so the second RFID reader can transmit the stored data to the server.

2. The method of claim 1, wherein said testing the forward link comprises: monitoring at the second RFID reader for a radio frequency (RF) signal transmitted from the RFID first reader.

3. The method of claim 1, further comprising: testing the backward link of the first RFID reader using the second RFID reader if it is determined that the RF signal is transmitted from the first RFID reader.

4. The method of claim 3, wherein said testing the backward link of the first RFID reader comprises: transmitting a simulated tag backscatter response signal from the second RFID reader to the first RFID reader.

5. The method of claim 1, wherein said to test a backward link comprises: transmitting a data string in a simulated tag backscatter response signal, wherein the first RFID reader provides diagnostic information to the server if the first RFID reader receives the data string, wherein the data string is operable to cause the first RFID reader to trigger a diagnostic analysis to provide the diagnostic information to the server.

6. The method of claim 4, further comprising: determining whether the first RFID reader received the tag backscatter response signal.

7. The method of claim 6, wherein said determining comprises: receiving an indication at the server from the first RFID reader that the tag backscatter response signal was received.

8. The method of claim 7, wherein the indication includes diagnostic information regarding the first RFID reader.

9. The method of claim 1, further comprising: receiving an instruction at the second RFID reader from a server over a communications network to perform said testing.

* * * * *